US010997674B2

(12) United States Patent
Ventola et al.

(10) Patent No.: US 10,997,674 B2
(45) Date of Patent: May 4, 2021

(54) DETERMINING A CHARACTERISTIC OF AN INERTIAL CONTRIBUTION TO AN ELECTRIC POWER GRID

(71) Applicant: Reactive Technologies Limited, Oxford (GB)

(72) Inventors: Mika Ventola, Oulu (FI); Jukka Alakontiola, Oulu (FI); Marc Borrett, Poole (GB); Ville Paju, Oulu (FI); Timo Peltola, Lohja (FI)

(73) Assignee: Reactive Technologies Limited, Oxford (GB)

( * ) Notice: Subject to any disclaimer, the term of this patent is extended or adjusted under 35 U.S.C. 154(b) by 154 days.

(21) Appl. No.: 16/425,419

(22) Filed: May 29, 2019

(65) Prior Publication Data

US 2019/0293698 A1 Sep. 26, 2019

Related U.S. Application Data

(63) Continuation of application No. PCT/EP2017/080702, filed on Nov. 28, 2017.

(30) Foreign Application Priority Data

Nov. 30, 2016 (GB) .................................... 1620329

(51) Int. Cl.
*G01R 19/25* (2006.01)
*G06Q 50/06* (2012.01)
(Continued)

(52) U.S. Cl.
CPC ......... *G06Q 50/06* (2013.01); *G01R 19/2513* (2013.01); *G08C 17/02* (2013.01);
(Continued)

(58) Field of Classification Search
CPC ................................................. G01R 19/2513
See application file for complete search history.

(56) References Cited

U.S. PATENT DOCUMENTS

| 8,688,282 B2 * | 4/2014 | Garcia | H02J 3/381 |
| | | | 700/287 |
| 9,122,274 B2 * | 9/2015 | Nielsen | G05B 23/0256 |
| (Continued) | | | |

FOREIGN PATENT DOCUMENTS

| GB | 2510735 A | 8/2014 |
| GB | 2515358 A | 12/2014 |

OTHER PUBLICATIONS

Ulbig et al., "Predictive Control for Real-Time Frequency Regulation and Rotational Inertia Provision in Power Systems", 52nd IEEE Conference on Decision and Control, Dec. 10-13, 2013, Florence, Italy, pp. 2946 to 2953, XP032576263, ISSN: 0743-1546, DOI:10.1109/CDC.2013.6760331, ISBN: 978-1-4673-5714-2.
(Continued)

*Primary Examiner* — Walter L Lindsay, Jr.
*Assistant Examiner* — Milton Gonzalez
(74) *Attorney, Agent, or Firm* — EIP US LLP

(57) ABSTRACT

Methods, and apparatus for determining a characteristic of an inertial contribution to an electrical power grid are described. A change in inertia in the electrical power grid based on one or more inertia measurements performed in a first time period is determined. On the basis of the determined change in inertia and data indicative of an inertia contribution characteristic of one or more energy production facilities and/or one or more energy consuming devices in the electric power grid, a characteristic of an inertial contribution to the electrical power grid is determined for a second time period different to the first time period.

20 Claims, 6 Drawing Sheets

(51) Int. Cl.
*G08C 17/02* (2006.01)
*H02J 3/38* (2006.01)
*H02J 3/24* (2006.01)
*H02J 3/00* (2006.01)

(52) U.S. Cl.
CPC ............... *H02J 3/24* (2013.01); *H02J 3/383* (2013.01); *H02J 3/003* (2020.01); *H02J 3/386* (2013.01); *Y02P 80/10* (2015.11)

(56) References Cited

U.S. PATENT DOCUMENTS

| 9,341,162 | B2* | 5/2016 | Garcia | H02J 3/381 |
| 9,562,925 | B2* | 2/2017 | Nulty | H02J 13/00017 |
| 10,019,024 | B2* | 7/2018 | Chan | H02J 13/00034 |
| 2005/0033481 | A1 | 2/2005 | Budhraja et al. | |
| 2019/0348839 | A1* | 11/2019 | Oakes | H02J 3/14 |

OTHER PUBLICATIONS

United Kingdom Combined Search and Examination Report dated May 18, 2017 for Application No. GB1620329.1.
International Search Report and Written Opinion dated Apr. 5, 2018 for PCT Application No. PCT/EP2017/080702.
International Search Report and Written Opinion dated Apr. 6, 2018 for PCT Application No. PCT/EP2017/080709.

* cited by examiner

DETERMINING A CHARACTERISTIC OF AN INERTIAL CONTRIBUTION TO AN ELECTRIC POWER GRID

CROSS-REFERENCE TO RELATED APPLICATIONS

This application is a continuation of International Application No. PCT/EP2017/080702, filed Nov. 28, 2017, which claims priority to UK Application No. GB1620329.1, filed Nov. 30, 2016, under 35 U.S.C. § 119(a). Each of the above-referenced patent applications is incorporated by reference in its entirety.

BACKGROUND OF THE INVENTION

Field of the Invention

The present invention relates to methods and systems for determining a characteristic of an inertial contribution to an electric power grid.

Description of the Related Technology

The exchange of electrical power between providers and consumers takes place via an electric power grid. In such an electric power grid, electrical power is typically supplied by a combination of relatively large capacity power stations and relatively small capacity renewable energy sources.

Generators in large power stations, such as fossil fuel-burning or nuclear power stations, typically comprise rotating parts that have relatively high mass that are rotating at relatively high speeds, and accordingly are referred to as spinning generation. In the course of their normal operation, the spinning generators store relatively large amounts of kinetic energy and contribute inertia to the electric power grid. Smaller renewable energy sources, such as wind turbines and solar power generators store a much smaller amount of energy, or even no energy at all, and contribute little or no inertia to the electric power grid.

Similarly, rotating machines in, for example, factories consume electric power and store kinetic energy which contribute to the total inertia in the electric power grid.

The relative contribution to the overall provision of energy by inertia-contributing and non-inertia-contributing generators is referred to as production mix. Production mix data may, for example, indicate the relative proportions of power provided by coal, nuclear, and gas powered generation facilities versus power provided by wind and solar powered production facilities. Information regarding the current production mix and likely future production mixes is valuable to system operators, network operators, and energy market traders, as it provides an indication of the stability of the electric power grid, and the anticipated output level from the production of electrical energy, which could indicate under/over-supply to the energy market. The total grid inertia may, for example, be calculated by summing up values of the inertia constant and nominal power of each active generator.

Production mix data based on past energy production data are published regularly. The production mix data may be based on, for example, values of nominal output power of each power generator in the electric power grid, as well as the number and location of power generators providing power to the electric power grid. However, this data is typically not available in real-time and, where the data is used to produce forecasts of future production mix, the forecasts may be inaccurate. For example, production mix data may be published 15 minutes, 1 hour or 1 day after the actual production has occurred. Furthermore, a drawback of calculating inertia from the known production data is that the method does not provide any insight into the contribution of energy consuming devices to the inertia of the electric power grid.

It is an object of the present invention to at least mitigate some of the problems of the prior art.

SUMMARY

According to a first aspect of the present invention, there is provided a method of determining a characteristic of an inertial contribution to an electric power grid, the method comprising:
determining a change in inertia in the electric power grid based on one or more inertia measurements performed in a first time period; and
determining, for a second time period different to the first time period, a characteristic of an inertial contribution to the electric power grid on the basis of the determined change and data indicative of an inertia contribution characteristic of one or more energy production facilities and/or one or more energy consuming devices in the electric power grid.

According to a second aspect of the present invention, there is provided a system for determining a characteristic of inertial contribution to an electric power grid, the system comprising:
a measurement means arranged to determine a change in inertia in the electric power grid based on one or more inertia measurements performed in a first time period; and
a processor arranged to determine, for a second time period different to the first time period, a characteristic of an inertial contribution to the electric power grid on the basis of the determined change and data indicative of one or more inertia contribution characteristics of one or more energy production facilities and/or one or more energy consuming devices in the electric power grid.

According to a third aspect of the present invention, there is provided a computer program which, when executed by a processor, causes the processor to:
determine a change in inertia in the electric power grid based on one or more inertia measurements performed in a first time period;
determine, for a second time period different to the first time period, a characteristic of an inertial contribution to the electric power grid on the basis of the determined change and data indicative of one or more inertia contribution characteristics of one or more energy production facilities and/or one or more energy consuming devices in the electric power grid.

Further features and advantages of the invention will become apparent from the following description of preferred embodiments of the invention, given by way of example only, which is made with reference to the accompanying drawings.

DETAILED DESCRIPTION OF CERTAIN INVENTIVE EMBODIMENTS

Typically, an electric power grid operates at a nominal grid frequency that is uniform throughout a synchronous area of the grid. For example, the UK mains supply nominally operates at 50 Hz. Grid operators are usually obliged to maintain the grid frequency to within predefined limits, for example the UK mains supply should be kept within 0.4% of the nominal 50 Hz grid frequency. If the balance between generation and consumption of electrical energy is not maintained (for example, if the total amount of generation cannot meet consumption during high demand periods, or if the output from a power generator changes, perhaps due to a fault in the generator) the net amount of energy stored in the generators of the grid can vary. This results in a change of the rotational speed of the spinning generators and a corresponding change in the operating frequency of the grid. Grid operators therefore use the system operating frequency as a measure of the balance between consumption and generation of electrical power in the grid.

Grid inertia is a measure of the amount of energy stored in the electric power grid and influences the rate at which the operating frequency of the grid changes in response to a change in grid balance. Regions of a synchronous electric power grid that have a high proportion of inertia-contributing (i.e. spinning) generation typically have a large amount of energy stored as rotational kinetic energy in the generators (that is they have high inertia) and therefore have a larger capacity to maintain the operating frequency of the grid at the nominal grid frequency. In contrast, regions of a synchronous electric power grid that have a low proportion of inertia-contributing generation and a relatively higher degree of non-inertia-contributing generation (such as, for example, solar power) have a relatively low amount of stored energy (that is they have low inertia) and therefore have less capacity to maintain the operating frequency of the grid at the nominal grid frequency.

Similarly, regions of the grid in which there are large amounts of spinning load (such as factories using rotating machines) contribute to the total grid inertia, whereas regions of the grid with a low amount of spinning load contribute little to the total grid inertia.

Consequently, the amount of inertia in an electric power grid may provide an indication of the relative amount of inertia-contributing generation and/or consumption relative to the amount of non-inertia-contributing generation and/or consumption. This may provide, for example, an indication of the relative contribution to total power generation from traditional sources of power (such as nuclear or fossil fuel powered steam turbines) with respect to renewable sources of power such as solar power generators.

Figure 1:
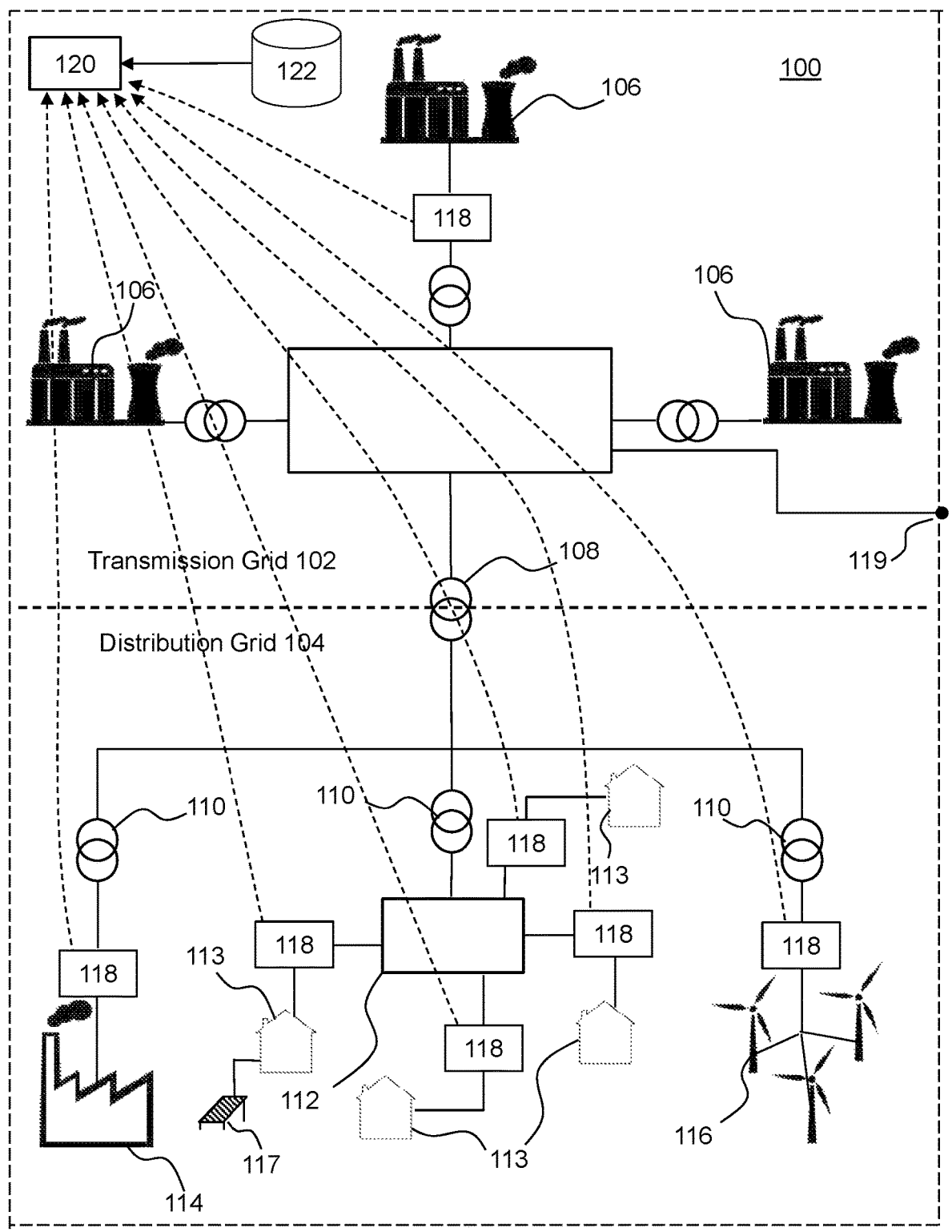
FIG. 1 is a schematic diagram illustrating an electric power grid in which the invention may be implemented.

Supply of electricity from providers such as power stations, to consumers, such as domestic households and businesses, typically takes place via an electric power grid. FIG. 1 shows an exemplary electric power grid 100, in which embodiments of the present invention may be implemented, comprising a transmission grid 102 and a distribution grid 104.

The transmission grid 102 is connected to power generators 106, which may be nuclear plants or gas-fired plants, for example, from which it transmits large quantities of electrical energy at very high voltages (typically of the order of hundreds of kV), over power lines such as overhead power lines, to the distribution grid 104.

The transmission grid 102 is linked to the distribution grid 104 via a transformer 108, which converts the electric supply to a lower voltage (typically of the order of 50 kV) for distribution in the distribution grid 104.

The distribution grid 104 is connected, via substations 110 comprising further transformers for converting to still lower voltages, to local networks which provide electric power to power consuming devices connected to the electric power grid 100. The local networks may include networks of domestic consumers, such as a city network 112, that supplies power to domestic appliances within private residences 113 that draw a relatively small amount of power in the order of a few kW. Private residences 113 may also use photovoltaic devices 117 to provide relatively small amounts of power for consumption either by appliances at the residence or for provision of power to the electric power grid 100. The local networks may also include industrial premises such as a factory 114, in which larger appliances operating in the industrial premises draw larger amounts of power in the order of several kW to MW. The local networks may also include networks of smaller power generators such as wind farms 116 that provide power to the electric power grid 100.

Although, for conciseness, only one transmission grid 102 and one distribution grid 104 are shown in FIG. 1, in practice a typical transmission grid 102 supplies power to multiple distribution grids 104 and one transmission grid 102 may also be interconnected to one or more other transmission grids 102.

Electric power flows in the electric power grid 100 as alternating current (AC), which flows at a system frequency, which may be referred to as a grid frequency (typically 50 or 60 Hz, depending on country). The electric power grid 100 operates at a synchronized frequency so that the frequency is substantially the same at each point of the grid.

The electric power grid 100 may include one or more direct current (DC) interconnects 119 that provide a DC connection between the electric power grid 100 and other electric power grids. Typically, the DC interconnects 119 connect to the high voltage transmission grid 102 of the electric power grid 100. The DC interconnects 119 provide a DC link between the various electric power grids, such that the electric power grid 100 defines an area which operates at a given, synchronised, grid frequency that is not affected by changes in the grid frequency of other electric power grids. For example, the UK transmission grid is connected to the Synchronous Grid of Continental Europe via DC interconnects.

The electric power grid 100 may also include one or more devices for use in measuring inertia in the electric power grid 100 (referred to hereinafter as inertia measuring devices 118). The inertia measuring devices 118 may be located in the distribution grid 104 or in the transmission grid 102, or at any other location of the electric power grid 100. In some examples, the inertia measuring devices 118 may be embedded in energy consuming devices drawing electrical energy from the transmission grid 104. In other examples, the inertia measuring devices 118 may be separate from any energy consuming device. Each inertia measuring device 118 may be located at a known location in the electric power grid 100. Although, for the sake of simplicity, only seven inertia measurement devices 118 are shown in FIG. 1, it will be understood that, in practice, the electric power grid 100 may comprise hundreds or thousands of such devices.

An example of an inertia measuring device 118 suitable for measuring inertia in the electric power grid 100 is described in the Applicant's co-pending patent application published with publication number GB2515358. However, it will be understood that embodiments of the present invention may use any means of measuring inertia in the electric power grid 100.

In some examples, a measurement centre 120 may collect inertia data from one or more of the inertia measuring devices 118. The measurement centre 120 together with one or more inertia measuring devices 118 forms a system for determining a characteristic of inertial contribution to an electric power grid 100.

The measurement centre 120 may be located within the geographical area of the electric power grid 100 as shown in FIG. 1, or may be located outside the geographical area of the electric power grid 100. The measurement centre 120 may comprise, for example, a computing device arrange to process and analyse inertia data in accordance with the methods described below.

The inertia measuring devices 118 may include a communications interface arranged to enable communication with the measurement centre 120 so that inertia data measured by the inertia measuring devices 118 may be sent to the measurement centre 120 for processing and analysis (indicated by the dashed arrows in FIG. 1). Similarly, the measurement centre 120 may comprise a communications interface for receiving such data. The measurement centre 120 may also be able to retrieve production and/or consumption data (indicated by the solid arrow in FIG. 1) stored in a database 122 via the communications interface. The measurement centre 120 may be arranged to aggregate inertia measurements from a plurality of locations in the electric power grid 100 to determine granular measurements of inertia for different regions of the electric power grid 100. In some examples, the measurement centre 120 may be configured to determine an average value of inertia over configurable regions of the grid. The configurable regions may include, for example, the electric power grid 100 as a whole, a county, city, town etc. or any other definable region of the electric power grid 100.

Figure 2:
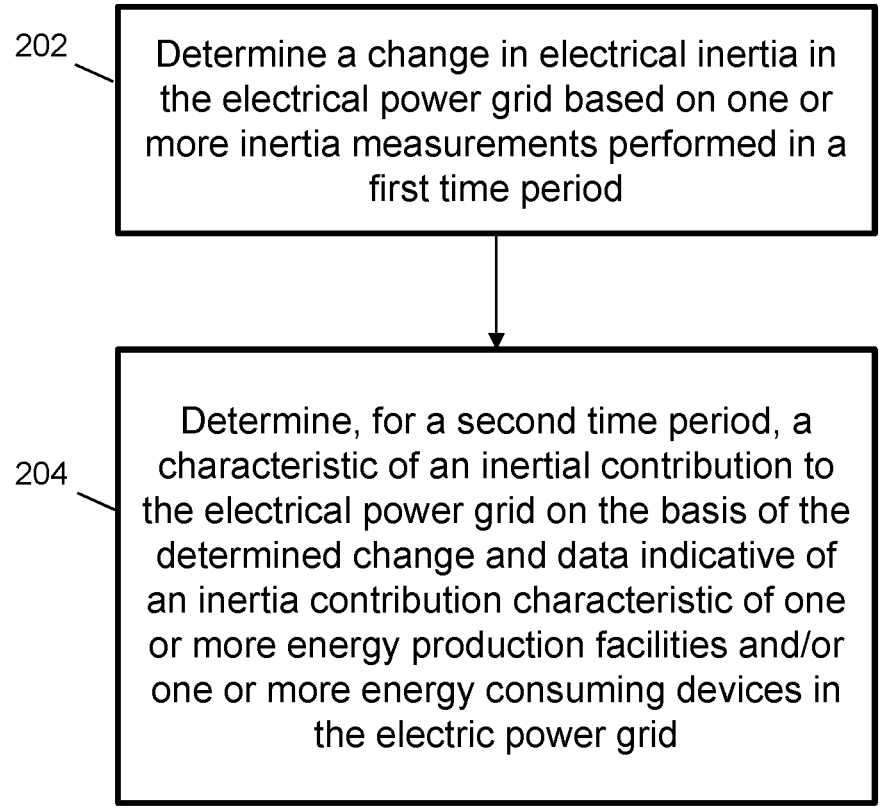
FIG. 2 is a flow diagram showing a method of determining a characteristic of an inertial contribution to an electric power grid.

FIG. 2 is a flow diagram showing a method 200 of determining a characteristic of an inertial contribution to an electric power grid, such as the electric power grid 100 described above with reference to FIG. 1.

The inertial contribution to the electric power grid 100 may be a contribution provided by one or more energy production facilities and/or by one or more energy consuming devices.

At block 202, a change in inertia in the electric power grid 100 is determined based on one or more inertia measurements performed in a first time period. The inertia measurements may be made, for example, using the inertia measuring devices 118 described above with reference to FIG. 1. The measurements may be made in one or more locations and may represent a local value of inertia (i.e. for a particular region of the electric power grid 100) or for the electric power grid 100 as a whole.

The change in inertia may, for example, be determined by analysing two or more inertia measurements made at different times. In some examples, the change in inertia may be determined by analysing a time series of inertia measurements.

At block 204, a characteristic of an inertial contribution to the electric power grid for a second time period, different to the first time period, is determined on the basis of the determined change in inertia and on data indicative of an inertia contribution characteristic of one or more energy production facilities and/or one or more energy consuming devices in the electric power grid.

The characteristic of inertial contribution may be, for example, a production mix value relating to a proportion of the total electric energy production in the electric power grid 100 generated by inertia-contributing production facilities. For example, production mix data may, for example, indicate the relative proportions of power provided by coal, nuclear, and gas powered generation facilities versus power provided by wind and solar powered production facilities, and may include data indicating an amount of power provided by individual production facilities. In other examples, the characteristic may be a value indicating a consumption mix i.e. relating to a proportion of the total energy consumption in the electric power grid 100 that is consumed by inertia-contributing energy consumption devices. In some examples, the characteristic of inertial contribution may indicate both production mix and consumption mix.

An inertia contribution characteristic of the energy production facilities may include a nominal rate of change of provision of electrical energy by those energy production facilities. For example, for a particular energy production facility it may be known that power generation ramps up at a particular rate. Similarly, an inertia contribution characteristic of the energy consuming devices may include a nominal rate of change of consumption of electrical energy by the one or more energy consuming devices.

The characteristic of an inertial contribution to the electric power grid 100 may be determined by identifying a difference in behaviour between the determined change in inertia and a change in energy consumption or production in the electric power grid 100, either over the electric power grid 100 as a whole or in a region of the electric power grid 100. The change in energy consumption or production may be measured in real time by a grid operator, for example. Based on the identified difference in behaviour, a change in energy provision and/or consumption by energy production facilities and/or energy consuming devices in the electric power grid 100 may be determined. Changes to the measured inertia, which do not follow a change in consumption or production of electrical energy may indicate a change in the production mix (i.e. the relative proportion of inertia-contributing generation) or consumption mix (i.e. the relative proportion of inertia-contributing consumption) in the electric power grid 100, or a region of the electric power grid 100. For example, as described in more detail below, an identified change of measured inertia may be identified as potentially being the result of a change in production by one or more production facilities based on prior data specifying operating characteristics of the one or more production facilities, or a change in consumption by one or more energy consuming devices based on prior data specifying operating characteristics of the one or more energy consuming devices. In particular, if it is known that a particular power generation facility or energy consumption device (or a group of such facilities or devices) behaves in a particular way when energy provision or consumption changes, a predication may be made that a particular production facility or energy consumption device (or group of such facilities or devices) may be responsible for the identified change in measured inertia. For example, it may be known that the power output of a particular energy production facility ramps up or ramps down at a known rate for a known time, and that such a facility has begun ramping up (or ramping down). When large-scale power generation facilities, such as nuclear or gas-fired power stations, ramp up the power supplied to the electric power grid 100, they typically first synchronise with the electric power grid 100 to match the generator frequency, phase angle and voltage magnitude with grid voltage frequency, phase angle & magnitude respectively and, once synchronised, ramp up the power they provide. It is at the point at which the generation facilities synchronise with the electric power grid 100 that they contribute the bulk of their inertial contribution to the electric power grid 100, but there is a lag between the point at which they synchronise and the time at which they provide a significant amount of electrical power to the electric power grid 100. Conversely, when such power generation facilities ramp down, they typically first reduce their provision of electrical power to the electric power grid 100 and only when their power provision is at a low level do they disconnect from the electric power grid 100; it is at the point of disconnection that the bulk of their inertial contribution is lost, but there is a lag between the reduction in the amount of power provided and a change in the inertial contribution. Since the time take for a power generation facility to ramp down may be known, a prediction can be made regarding the expected future behaviour of that facility and its effect on, for example, production mix within the known timeframe of the change. Furthermore, by continuing to monitor the measured inertia it is possible to verify and re-verify whether the prediction holds true.

In some examples, the data specifying the operating characteristics may relate to a particular type of production facility or energy consuming device, rather than a particular facility or device, and a prediction can be made regarding the expected future behaviour of that type of facility or device and its effect on, for example, production mix within the known timeframe of the change.

The second time period may be subsequent to the first period so that the determination of the inertial contribution to the electric power grid is a forecast, or prediction, of the inertial contribution at some future point in time, or during a future time period. However, in some examples, the second time period may be prior to the first time period, such that the method is used to determine the inertial contribution to the electric power grid 100 at a time previous to the time period in which the change in inertia is determined.

In order to determine the characteristic of an inertial contribution to the electric power grid 100 for the second time period (for example, a forecast of future production mix), a model relating changes of inertia to the characteristic of inertial contribution may be generated. The determined change in inertia and the data indicative of one or more inertia contribution characteristics (such as, for example, data relating to operating characteristics of production facilities or energy consuming devices) may then be applied to the model to determine the characteristic of inertial contribution.

Figure 3:
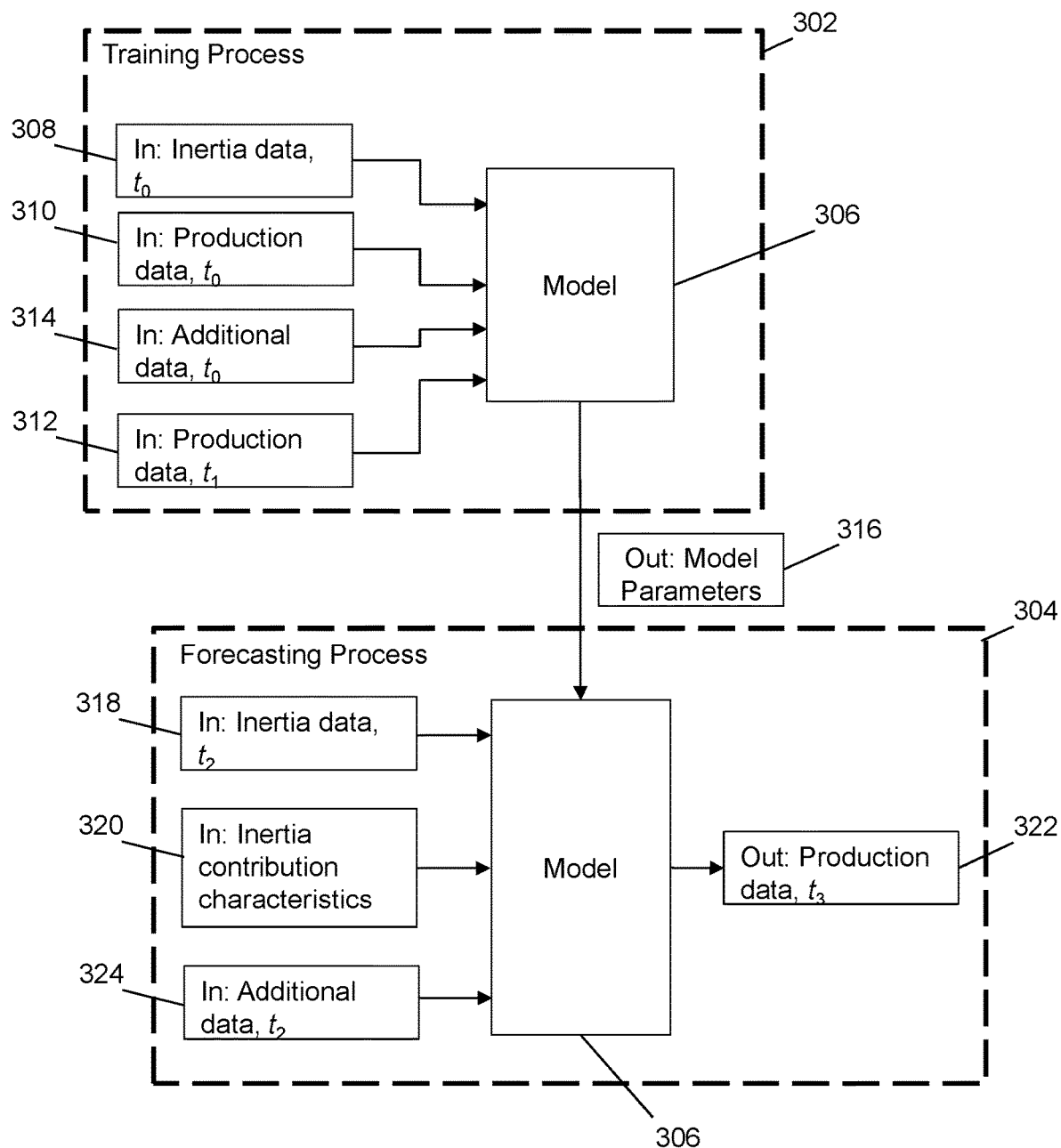
FIG. 3 is a schematic diagram illustrating training and forecasting processes used for determining a characteristic of an inertial contribution to an electric power grid.

FIG. 3 depicts an example of a process 300 for developing and using a model to determine a characteristic of an inertial contribution to the electric power grid 100. The process comprises a training process 302 and a determination process, referred to hereinafter as a forecasting process 304.

Although in general the forecasting process is envisaged as being used predominantly to determine future characteristics of inertial contribution (such as predicting future production mixes) it will be understood that the model is equally capable of being applied to determine past characteristics of inertial contribution. For example, the forecasting process 304 may receive as inputs a time series of data points and the output of the forecasting process 304 may be a subsequent point in the times series, or a preceding point in the time series.

During the training process 302, a model 306 receives training data relating to a previous time period, $t_0$. The training data comprises known inertia data 308 for the period $t_0$ (which may have been measured using the inertia measuring devices 118, for example), known production data 310 for the time period $t_0$ for one or more production facilities, and known production data 312 for a time period different to $t_0$; for example, for a subsequent time period $t_1$. The known production data 310, 312 may, for example, be obtained from the database 122.

Optionally, the training data may include additional data 314 relevant to the determination of characteristic of an inertial contribution to the electric power grid 100. For example, the additional data 314 may include data indicative of one or more of: weather; time of day; day of the week; month; season; energy market prices; a change in grid frequency; public events; and television broadcasts. The additional data 314 may be obtained from the database 122 or from any other appropriate source.

Using the training data, the training process 302 determines parameters 316 of the model 306 for subsequent use during the forecasting process 304. For example, a set of values of inertia 308 may be measured in a first time period (i.e. $t_0$). Data indicative of a first characteristic of inertial contribution in the first time period may be accessed. For example, production mix data 310 for the first time period may be obtained from a network operator. Data indicative of a second characteristic of inertial contribution in a second time period, such as production mix data 312 for the second time period may also be accessed. Using the data indicative of the first and second characteristics of inertial contribution (e.g. production mix data 310, 312 for the first and second time periods) and the measured inertia values 308 for the first time period, a relationship between the set of values of inertia 308 measured in the first time period, the first characteristic of inertial contribution, and the second characteristic of inertial contribution can be determined. Based on the determined relationship, the parameters 316 of the model 306 can be determined. In other words, the model 306 may be trained to determine an expected production mix for a time for which there is no inertia measurement data (e.g. a future time period) based on known inertia values and a known production mix for a corresponding time period, and the parameters 316 may be representative of a statistical relationship between the inputs to the model 306 and the output of the model 306.

Once the parameters 316 of the model 306 have been determined, those parameters 316 may be used by the forecasting process 304 to operate the model 306 to determine unknown characteristics of an inertial contribution to the electric power grid 100 based on further measurements of inertia. In particular, as shown in FIG. 3, during the forecasting process 304, the model 306 may receive further inertia data 318 during a time period $t_2$. The model 306, for which the parameters 316 have been determined during the training process 302, may then provide a determination of a characteristic of an inertial contribution to the electric power grid 100 for a time period t₃ based on a determined change in inertia in the electric power grid 100 (i.e. determined using the further inertia data 318) and data 320 indicative of an inertia contribution characteristic of one or more energy production facilities in the electric power grid. For example, the model 306 may output production mix data 322 for the time period $t_3$.

In some examples, for the forecasting process 304 the model 306 may receive additional data 324 relevant to the determination of the inertial contribution to the electric power grid 100. For example, the additional data 324 may be retrieved from the database 122. The additional data 324 received by the model 306 for the forecasting process 304 may comprise equivalent data to the additional data 314 used by the model 306 for the training process 302. For example, the additional data 324 may include data indicative of one or more of: weather; time of day; day of the week; month; season; energy tariffs; fuel prices; energy distribution and/or transmission charges; run requests or instructions; curtailment requests or instructions; energy market prices; a change in grid frequency; public events; and television broadcasts.

The type of model 306 used, and the parameters 316 of the model 306 determined during the training process 302, and subsequently used by the model 306 in the forecasting process 304, may be selected according to the properties of the electric power grid 100 (or region thereof that is of interest). For example, the model may include one or more of: a machine learning algorithm; a least squares fit; a random forest regression; and a neural network.

Although in the example described above with reference to FIG. 3, production data 310, 312 is used to train the model 306 so as to determine the parameters 316 of the model 306 in the training process 302, and the model 306 is subsequently used to determine production data 322 in the forecasting process 304, in some examples consumption data may be used instead of, or as well as, production data.

Figure 4:
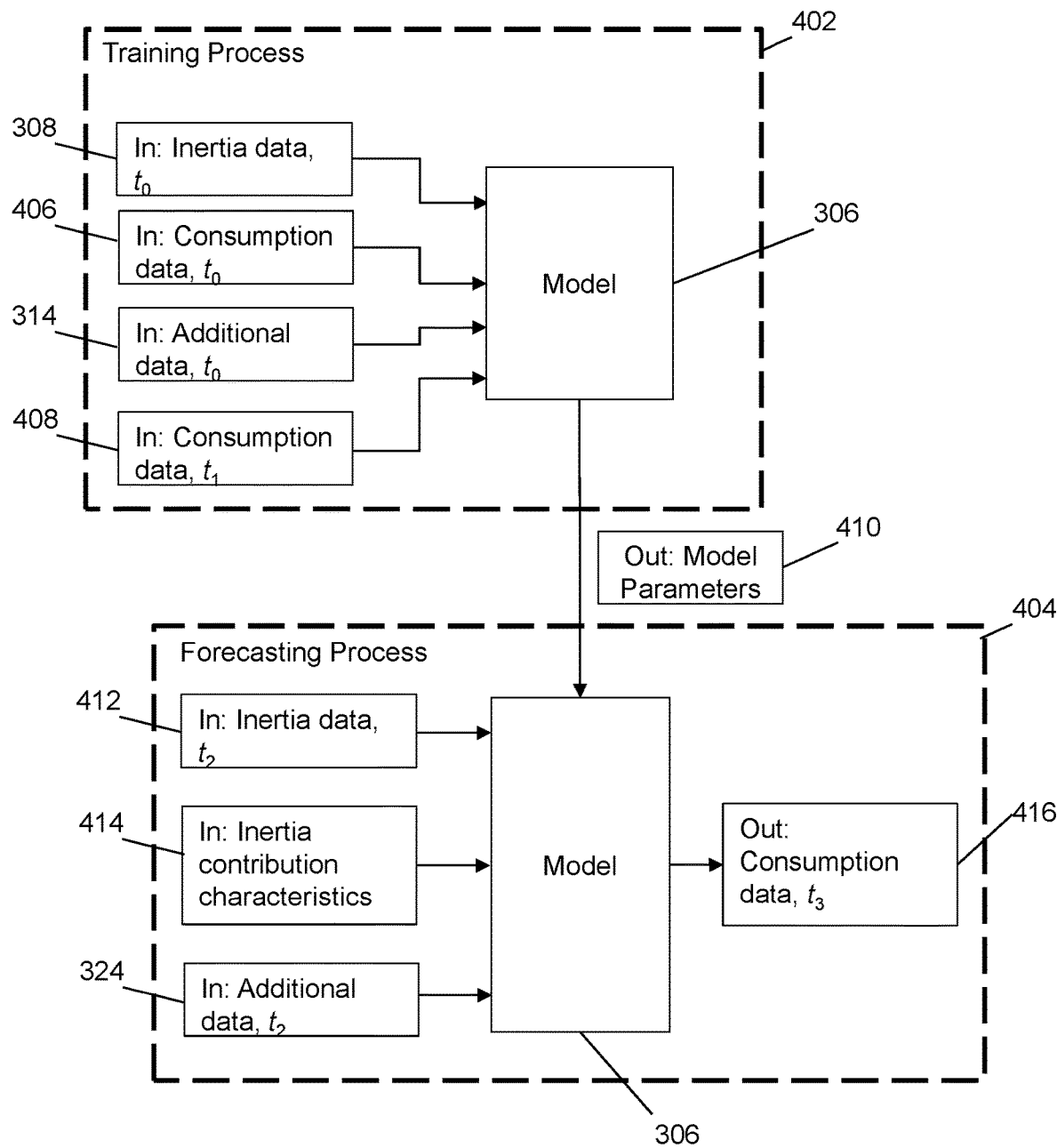
FIG. 4 is a schematic diagram illustrating training and forecasting processes used for determining a characteristic of an inertial contribution to an electric power grid.

FIG. 4 depicts an example of a process 400 for developing and using the model 306 to determine a characteristic of an inertial contribution to the electric power grid 100. Similar to the example described with reference to FIG. 3, the process 400 comprises a training process 402 and a forecasting process 404.

During the training process 402, the model 306 receives training data relating to a previous time period, $t_0$. The training data comprises known inertia data 308 for the period $t_0$ (which may have been measured using the inertia measuring devices 118, for example), known consumption data 406 for the time period $t_0$ for one or more energy consumption devices, and known consumption data 408 for a time period different to $t_0$; for example, for a subsequent time period $t_1$.

Using the training data, the training process 402 determines parameters 410 of the model 306 for subsequent use during the forecasting process 404. For example, a set of values of inertia may be measured in a first time period (i.e. $t_0$). Data indicative of a first characteristic of inertial contribution in the first time period may be accessed. For example, consumption mix data for the first time period may be obtained from a network operator. Data indicative of a second characteristic of inertial contribution in a second time period, such as consumption mix data for the second time period may also be accessed. Using the data indicative of the first and second characteristics of inertial contribution (e.g. consumption mix data for the first and second time periods) and the measured inertia values for the first time period, a relationship between the set of values of inertia measured in the first time period, the first characteristic of inertial contribution, and the second characteristic of inertial contribution can be determined. Based on the determined relationship, the parameters 410 of the model 306 can be determined. In other words, the model 306 may be trained to determine an expected consumption mix for a time for which there is no inertia measurement data (e.g. a future time period) based on known inertia values and a known consumption mix for a corresponding time period, and the parameters 410 may be representative of a statistical relationship between the inputs to the model 306 and the output of the model 306.

Once the parameters 410 of the model 306 have been determined, those parameters 410 may be used by the forecasting process 404 to operate the model 306 to determine unknown characteristics of an inertial contribution to the electric power grid 100 based on further measurements of inertia. In particular, as shown in FIG. 3, during the forecasting process 404, the model 306 may receive further inertia data 412 during a time period $t_2$. The model 306, for which the parameters 410 have been determined during the training process 402, may then provide a determination of a characteristic of an inertial contribution to the electric power grid 100 for a time period $t_3$ based on a determined change in inertia in the electric power grid 100 (i.e. determined using the further inertia data 412) and data 414 indicative of an inertia contribution characteristic of one or more energy consuming devices in the electric power grid. For example, the model 306 may output consumption mix data 416 for the time period $t_3$.

Similar to the model 300 described with reference to FIG. 3, the training process 402 may use additional data 314 to determine the parameters 410 of the model 306 and the forecasting process may use equivalent additional data 324 in its determination of the inertial contribution to the electric power grid 100. For example, the additional data 314 may be retrieved from the database 122.

Figure 5:
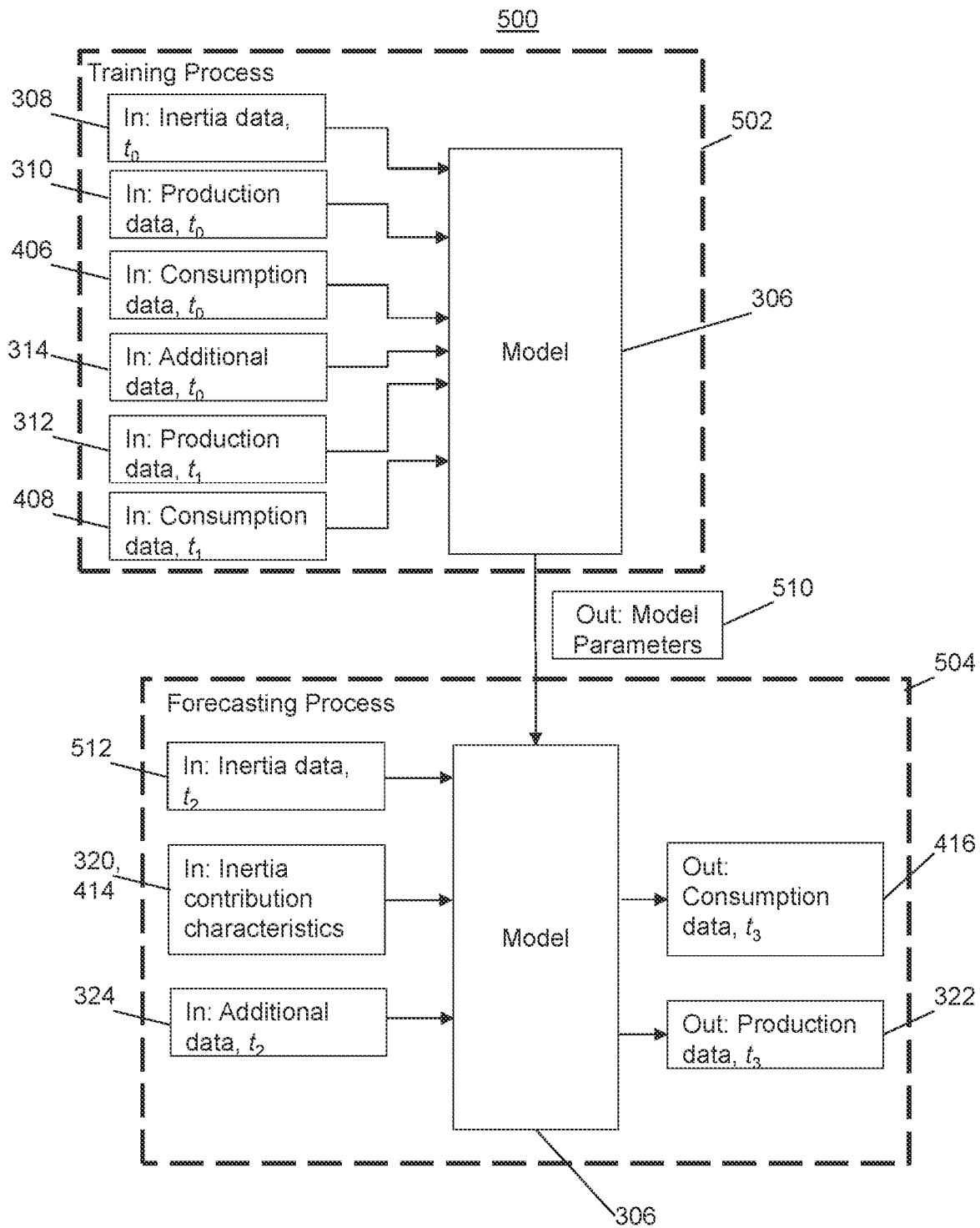
FIG. 5 is a schematic diagram illustrating training and forecasting processes used for determining a characteristic of an inertial contribution to an electric power grid.

FIG. 5 depicts a further example of a process 500 for developing and using a model to determine a characteristic of an inertial contribution to the electric power grid 100. The process comprises a training process 502 and a determination process, referred to hereinafter as a forecasting process 504. Although in general the forecasting process is envisaged as being used predominantly to determine future characteristics of inertial contribution (such as predicting future production mixes) it will be understood that the model is equally capable of being applied to determine past characteristics of inertial contribution.

During the training process 502, the model 306 receives training data relating to a previous time period, $t_0$. The training data comprises known inertia data 308 for the period $t_0$ (which may have been measured using the inertia measuring devices 118, for example), known production data 310 for the time period $t_0$ for one or more production facilities, known consumption data 406 for the time period $t_0$ for one or more energy consumption devices, known production data 312 for a time period different to $t_0$, and known consumption data 408 for a time period different to $t_0$.

Using the training data, the training process 502 determines parameters 510 of the model 306 for subsequent use during the forecasting process 504. For example, a set of values of inertia may be measured in a first time period (i.e. $t_0$). Data indicative of a first characteristic of inertial contribution in the first time period may comprise production mix data and consumption mix data for the first time period and data indicative of a second characteristic of inertial contribution in a second time period may comprise production mix data and consumption mix data for the second time period. Using the data indicative of the first and second characteristics of inertial contribution (e.g. production and consumption mix data for the first and second time periods) and the measured inertia values for the first time period, a relationship between the set of values of inertia measured in the first time period, the first characteristic of inertial contribution, and the second characteristic of inertial contribution can be determined. Based on the determined relationship, the parameters 510 of the model 306 can be determined. The model 306 may be trained to determine an expected production mix, an expected consumption mix, or a combined expected production and consumption mix for a time for which there is no inertia measurement data (e.g. a future time period) based on known inertia values and a known production mix and consumption mix data for a corresponding time period.

Once the parameters 510 of the model 306 have been determined, during the forecasting process 504, the model 306 may receive further inertia data 512 during a time period $t_2$. The model 306, for which the parameters 510 have been determined during the training process 502, may then provide a determination of a characteristic of an inertial contribution to the electric power grid 100 for a time period $t_3$ based on a determined change in inertia in the electric power grid 100 (i.e. determined using the further inertia data 512) and data 320 indicative of an inertia contribution characteristic of one or more energy production facilities and/or one or more energy consuming devices in the electric power grid. For example, the model 306 may output production mix data 322 and/or consumption mix data 416 for the time period $t_3$.

In some examples, data relating to the consumption mix may be used to improve the accuracy of output production mix data. Since the measured inertia comprises inertia contributions from energy production facilities and energy consuming devices, in some examples a determined value of future (for example) production mix based on an inertia measurement may be inaccurate due to the unknown relative contributions to inertia by production facilities and energy consuming devices. Therefore, by using both consumption and production data in the training process 502 and the forecasting process 504, the model 306 may take account of the relative contributions to inertia by production facilities and energy consuming devices when determining a production mix. Similarly, data relating to the production mix may be used to improve the accuracy of output consumption mix data.

The model 306 described above with reference to FIGS. 3 to 5, may be used to determine production mix data or consumption mix data (or both) based on measurements of inertia. The measured inertia may, as described above, be that of the electric power grid 100 as a whole (for example, based on an aggregated average of inertia measurements), or a local measurement of inertia in a region of the electric power grid (for example, local to the inertia measuring device 118). In some examples, the measurement centre 120 may collate from multiple inertia measuring devices 118 to map inertia within the electric power grid 100.

In some examples, the output of the model 306 may specify a probabilistic measure with the determination of the inertial contribution to the electric power grid 100. For example, the output may specify a certainty (for example a percentage chance) that a particular production facility or energy consuming device (or group of such facilities or devices) is changing its production or consumption, the time for which the change is likely to continue, and/or the effect on production mix and/or consumption mix.

The measurement centre 120 may use the location of the measured values of inertia together with the location of production facilities and/or energy consumption devices and their operating characteristics to identify local (regional) changes and to determine local production mix and/or consumption mix data. For example, the measurement centre 120 may have location data specifying the locations of a particular type of production facility (for example, nuclear power plants) and based on the location data the measurement centre 120 may identify that those production facilities are located in particular regions of the electric power grid 100. The measurement centre 120 may thereby use the location of production facilities to more accurately predict changes in production mix (or consumption mix, or both) in specific regions of the electric power grid 100.

Figure 6:
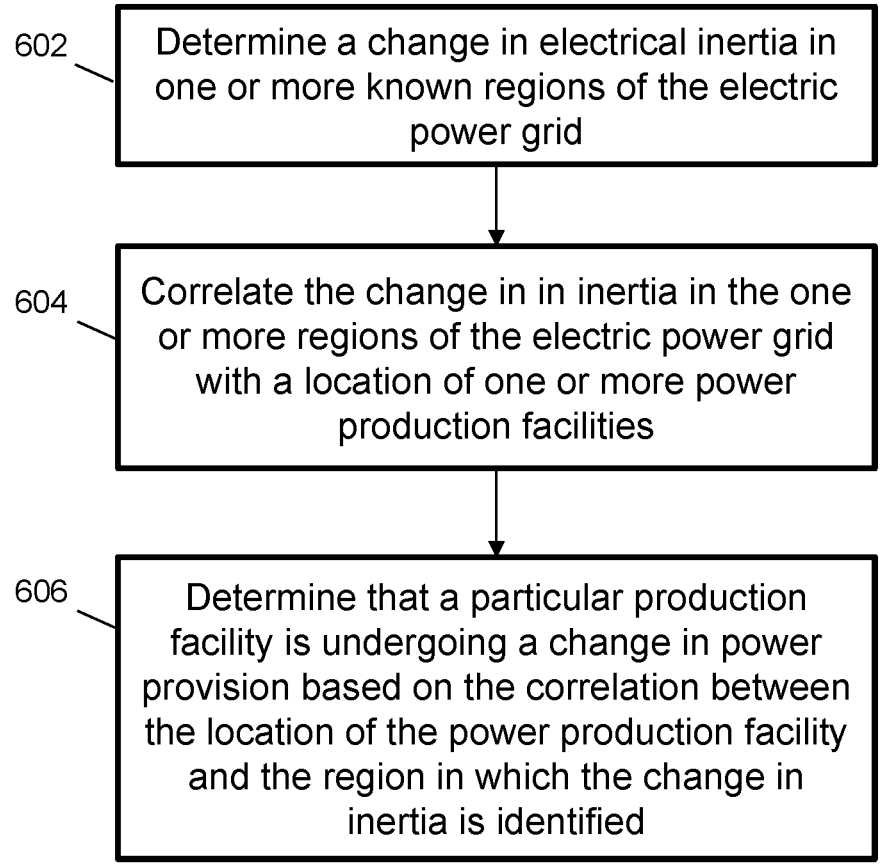
FIG. 6 is a flow diagram showing a method of determining a characteristic of an inertial contribution to an electric power grid.

FIG. 6 is a flow diagram illustrating an example method 600 by which the measurement centre 120 may use the location of production facilities to predict changes in production mix (or consumption mix, or both) in specific regions of the electric power grid 100.

At block 602, a change in inertia in one or more known regions of the electric power grid 100 is determined. For example, the measurement centre 120 may determine a change in inertia in a particular region of the electric power grid 100 on the basis of location data identifying the location of an inertia measuring device 118.

At block 604, a location of one or more power production facilities may be correlated with the change in in inertia in the one or more regions of the electric power grid 100. For example, based on location data identifying the location of the one or more production facilities in the electrical power grid 100, the measurement centre 120 may determine that a particular production facility (or group of facilities) is located in a particular region.

At block 606, based on the correlation between the location of the power production facility and the region in which the change in inertia is identified, a determination that a particular production facility is undergoing a change in power provision is made. For example, the measurement centre 120 may correlate the change in inertia with a known inertia provided by a production facility located in the region in which the change in inertia is detected, based on known operating characteristics of the production facilities in that region.

In some examples, the measurement centre 120 may determine that the change in inertia in that region does not correspond with a change in electrical power consumption or generation in the electric power grid 100. On the basis of the difference in behaviour of the determined change in inertia and changes in power provision or consumption, the measurement centre 120 may predict a change in the production mix in that region in which the change in inertia is determined. In some examples, the measurement centre 120 may utilise location data specifying the locations of production facilities in the same region and/or data specifying the operating characteristics of those production facilities, and may therefore determine which of the production facilities in the region may be responsible for the determined change in inertia.

Furthermore, the measurement centre 120 may have access to data indicating a rate at which a particular production facility or energy consumption device (or type of facility or device) ramps up and/or ramps down its power provision or consumption and may use that data to make predictions about a future state of regional inertia and/or inertia in the electric power grid 100 as a whole. For example, the measurement centre 120 may determine that three hours ago a high inertia plant (such as a power station) started to ramp down its power provision at a rate of 100 MW/h in a particular region of the electric power grid 100. By knowing that there are only certain production facilities (or types of facilities) in that region that could cause this behaviour, the measurement centre 120 can determine that it is due to a particular facility (or one of a group of similar facilities) and, knowing the operating characteristics of such a facility, can predict that behaviour to continue for a further period of, for example, six hours.

Similarly, the measurement centre 120 may have access to data relating to known or expected changes in consumption, which be indicative of changes to the contribution to inertia from energy consuming devices, which may be accessed from the database 122. For example, the measurement centre 120 may have access to production schedules for large scale industrial sites, providing prior data specifying when industrial machinery that contributes inertia will be powered up or down, the rates at which the power consumption of that machinery change and/or the inertial contribution of that machinery. Other data which the measurement centre 120 may have access to include external pricing/cost data and schedules of events that may have an effect on energy consumption without a corresponding effect on an inertial contribution to the electric power grid 100. Such events may include public events, such as national holidays, sporting events and concerts. The data may include energy tariffs, fuel prices, energy distribution and/or transmission charges, run requests or instructions, curtailment requests or instructions, energy market prices, television broadcast schedules, which may indicate when an increase in the relative use of non-inertia-contributing devices (such as kettles) and inertia-contributing device (such as refrigerators). The data may also include travel schedules such as train timetables, which may indicate times when an increase in inertia-contributing load may be expected.

The above embodiments are to be understood as illustrative examples of the invention. Other embodiments are envisaged. For example, although in embodiments described above, measurements of inertia are used to determine a characteristic of an inertia contribution to an electric power grid, in some embodiments other metrics closely related to inertia, such as rate of change of frequency (RoCoF) may be used. It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention, which is defined in the accompanying claims.

What is claimed is:

1. A method of determining a characteristic of an inertial contribution to an electrical power grid, the method comprising:
    determining a change in inertia in the electrical power grid based on inertia measurements performed in a first time period; and
    determining, for a second time period different to the first time period, a characteristic of an inertial contribution to the electrical power grid on the basis of the determined change and data indicative of an inertia contribution characteristic of one or more energy production facilities and/or one or more energy consuming devices in the electric power grid.

2. A method according to claim 1, wherein the inertial contribution to the electrical power grid is a contribution provided by the one or more energy production facilities.

3. A method according to claim 2, wherein the characteristic of inertial contribution relates to a proportion of the total electrical energy production in the electrical power grid generated by inertia-contributing energy production facilities.

4. A method according to claim 1, wherein the inertial contribution to the electrical power grid is a contribution provided by the one or more energy consuming devices.

5. A method according to claim 4, wherein the characteristic of inertial contribution relates to a proportion of the total electrical energy consumption in the electrical power grid consumed by inertia-contributing energy consuming devices.

6. A method according to claim 1, comprising:
    determining a difference in behaviour between the determined change in inertia and a change in total energy consumption in the electrical power grid; and
    determining, on the basis of the identified difference in behaviour, a change in electrical energy provision by the one or more energy production facilities.

7. A method according to claim 6, wherein the change in electrical energy provision comprises an increase or decrease in electrical energy production.

8. A method according to claim 1, wherein the data indicative of one or more inertia contribution characteristics comprises data specifying a nominal rate of change of provision of electrical energy by the one or more energy production facilities and/or a nominal rate of change of consumption of electrical energy by the one or more energy consuming devices.

9. A method according to claim 1, comprising determining a change in inertia at a first location in the electrical power grid and determining the characteristic of inertial contribution on the basis of a location of the one or more energy production facilities and/or one or more energy consuming devices.

10. A method according to claim 9, comprising, on the basis of the location data, identifying that a particular inertia-contributing entity is undergoing a change in energy provision or consumption and determining the characteristic of inertial contribution on the basis of an operating characteristic of that entity.

11. A method according to claim 1, wherein the determined characteristic of inertial contribution to the electrical power grid is a predicted future characteristic.

12. A method according to claim 1, comprising:
    generating a model relating changes of inertia to the characteristic of inertial contribution; and
    applying the determined change in inertia and the data indicative of one or more inertia contribution characteristics to the model to determine the characteristic of inertial contribution.

13. A method according to claim 12, comprising:
    measuring a set of values of inertia in the first time period;
    accessing data indicative of a first characteristic of inertial contribution in the first time period; and
    determining a relationship between the measured set of values of inertia and the first characteristic of inertial contribution.

14. A method according to claim 12, comprising:
    measuring a set of values of inertia in the first time period;

accessing data indicative of a first characteristic of inertial contribution in the first time period;

accessing data indicative of a second characteristic of inertial contribution in the second time period;

determining a relationship between the set of values measured in the first time period, the first characteristic of inertial contribution, and the second characteristic of inertial contribution; and determining parameters of the model based on the determined relationship.

15. A method according to claim 14, wherein the determined relationship is determined at least partly on the basis of a location of the one or more energy production facilities and/or the one or more energy consuming devices.

16. A method according to claim 14, wherein the determined relationship is determined at least partly on the basis of a power generation property of the one or more energy production facilities.

17. A method according to claim 12, wherein the model one or more of: a machine learning algorithm; a least squares fit; a random forest regression; and a neural network.

18. A method according to claim 1, comprising determining a relationship between the determined change in inertia and further data, the further data being indicative of one or more of: weather; time of day; day of the week; month; season; energy tariffs; fuel prices; energy distribution and/or transmission charges; run requests or instructions; curtailment requests or instructions; energy market prices; a change in grid frequency; public events; and television broadcasts.

19. A system for determining a characteristic of inertial contribution to an electrical power grid, the system comprising:

a measurement means arranged to determine a change in inertia in the electrical power grid based on inertia measurements performed in a first time period; and a processor arranged to determine, for a second time period different to the first time period, a characteristic of an inertial contribution to the electrical power grid on the basis of the determined change and data indicative of one or more inertia contribution characteristics of one or more energy production facilities and/or one or more energy consuming devices in the electric power grid.

20. A non-transitory computer-readable storage medium storing instructions that, when executed by a processor, cause the processor to:

determine a change in inertia in the electrical power grid based on inertia measurements performed in a first time period;

determine, for a second time period different to the first time period, a characteristic of an inertial contribution to the electrical power grid on the basis of the determined change and data indicative of one or more inertia contribution characteristics of one or more energy production facilities and/or one or more energy consuming devices in the electric power grid.

* * * * *